United States Patent
Reinmuth et al.

(10) Patent No.: US 8,587,095 B2
(45) Date of Patent: Nov. 19, 2013

(54) METHOD FOR ESTABLISHING AND CLOSING A TRENCH OF A SEMICONDUCTOR COMPONENT

(75) Inventors: Jochen Reinmuth, Reutlingen (DE); Eckhard Graf, Gomaringen (DE)

(73) Assignee: Robert Bosch GmbH, Stuttgart (DE)

( * ) Notice: Subject to any disclaimer, the term of this patent is extended or adjusted under 35 U.S.C. 154(b) by 333 days.

(21) Appl. No.: 13/004,638

(22) Filed: Jan. 11, 2011

(65) Prior Publication Data

US 2011/0169143 A1 Jul. 14, 2011

(30) Foreign Application Priority Data

Jan. 14, 2010 (DE) .......................... 10 2010 000 895

(51) Int. Cl.
*H01L 23/552* (2006.01)
*H01L 21/764* (2006.01)

(52) U.S. Cl.
USPC ............ 257/659; 257/E23.144; 257/E21.573; 438/422

(58) Field of Classification Search
USPC ......... 257/117, 118, 127, 170, 244, 283, 397, 257/466, 571, 586, 589, 622, E21.537, 257/E21.439, E21.546, 659, E23.114, 257/E21.539, E21.573; 438/422, 424–426, 438/430–432
See application file for complete search history.

(56) References Cited

U.S. PATENT DOCUMENTS

| 6,764,605 B2 * | 7/2004 | Donaldson et al. ............. 216/39 |
| 2008/0142928 A1 | 6/2008 | Sitaram et al. ................ 257/621 |

FOREIGN PATENT DOCUMENTS

DE 10 2007 059 337 7/2008

* cited by examiner

*Primary Examiner* — Julio J Maldonado
*Assistant Examiner* — Daniel Shook
(74) *Attorney, Agent, or Firm* — Kenyon & Kenyon LLP (57) ABSTRACT

A method for establishing and closing at least one trench of a semiconductor component, in particular a micromechanical or electrical semiconductor component, having the following steps: applying at least one metal layer over the trench to be formed; forming a lattice having lattice openings in the at least one metal layer over the trench to be formed; forming the trench below the metal lattice, and closing the lattice openings over the trench.

16 Claims, 6 Drawing Sheets

METHOD FOR ESTABLISHING AND CLOSING A TRENCH OF A SEMICONDUCTOR COMPONENT

RELATED APPLICATION INFORMATION

The present application claims priority to and the benefit of German patent application no. 10 2010 000 895.8, which was filed in Germany on Jan. 14, 2010, the disclosure of which is incorporated herein by reference.

FIELD OF THE INVENTION

The present invention relates to a method for establishing and closing a trench of a semiconductor component, and a semiconductor component having at least one trench which is established and closed according to the method, the trench being formed around a through contact or at least one component, such as an analog or digital component, etc., of the semiconductor component.

BACKGROUND INFORMATION

There are electrical contacts through a wafer or through a subarea of a wafer in greatly varying embodiments. These through contacts are becoming increasingly significant. If multiple components are placed vertically one on top of another, very beneficial and small-dimensioned arrangements may be obtained by integrating electrical through contacts into the component.

A micromechanical component is discussed in german Patent Document DE 10 2007 059 337 A1, which has multiple through contacts, in order to be able to interconnect the micromechanical component with another micromechanical component, for example.

SUMMARY OF THE INVENTION

A method is provided according to the present invention, during which a trench of a contact may be established and closed.

More precisely, a method for establishing and closing at least one trench of a semiconductor component, in particular a micromechanical or electrical semiconductor component, is provided, having the following steps:
applying at least one metal layer over the trench to be formed,
forming a lattice having lattice openings in the at least one metal layer over the trench to be formed,
forming the trench below the metal lattice, and
closing the lattice openings over the trench.

The method has the advantage, on the one hand, that a trench may be formed over the metal lattice. On the other hand, the metal lattice, and thus the trench, may be closed very well. In this way, very large trenches may also be established and in particular subsequently closed. A further advantage is that the metal lattice may additionally be used as a printed conductor or printed conductors. In addition, metal or a metal alloy has the advantage that it may be used very well as masking.

Advantageous embodiments and refinements of the exemplary embodiments and/or exemplary methods of the present invention result from the further description herein and the description with reference to the drawings.

The exemplary embodiments and/or exemplary methods of the present invention are explained in greater detail hereafter on the basis of the exemplary embodiments specified in the schematic figures of the drawings.

DETAILED DESCRIPTION

In all figures, identical or functionally identical elements and devices—if not specified otherwise—have been provided with the same reference numerals. Furthermore, the illustration of the wafer or that of the semiconductor component in the following figures is shown purely schematically, not to scale, and greatly simplified.

Figure 1:
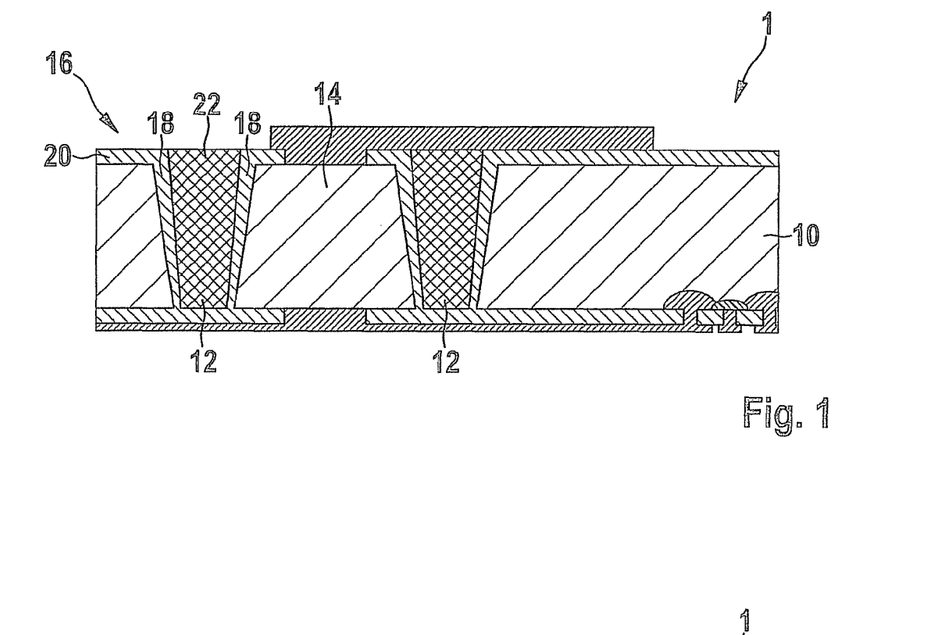
FIG. 1 shows a sectional view through a wafer, in which a trench around a through contact is closed via a polysilicon deposit.

A wafer 1 is illustrated in FIG. 1, in which a through contact 14 is provided, an insulation trench 12 around through contact 14 being closed by an oxide filling.

A particularly simple method for establishing through contacts 14 is to use a conductive substrate 10 and to use the substrate material itself as a printed conductor. Conductive substrate material 10 is removed in a trench 12 around a through contact 14. A trenching process may be used for this purpose, using which a narrow insulation ring or trench 12 having a very high aspect ratio is etched. The middle, conductive part of through contact 14 must be suspended in this case by insulating elements.

There are various methods for this purpose. Many processing variants are oriented to closing trench 12 on surface 16, efforts being made to achieve the smoothest possible surface 16. The advantage of such a procedure is that after closing of trench 12, standard processing steps, such as CMOS processes and MEMS processes, are possible on a smooth surface 16. In contrast, if trenches 12 remain open, many processes are thus no longer possible or this may have the result that the trenches are filled in an undefined way. In the most unfavorable case, this may have the result that the insulation properties or the reliability of through contacts 14 are put into question.

There are various methods for closing described trenches 12. In the specific embodiment shown in FIG. 1, trenches 12 are established having a slightly open geometry 18. Subsequently, trenches 12 are closed by an oxide layer 20 for insulation and a polysilicon deposit 22 for filling, for example. In order to obtain a smooth through contact 14, surface 16 must still be planarized thereafter. This method proves to be complex, since trench 12 must be completely filled up.

Figure 2:
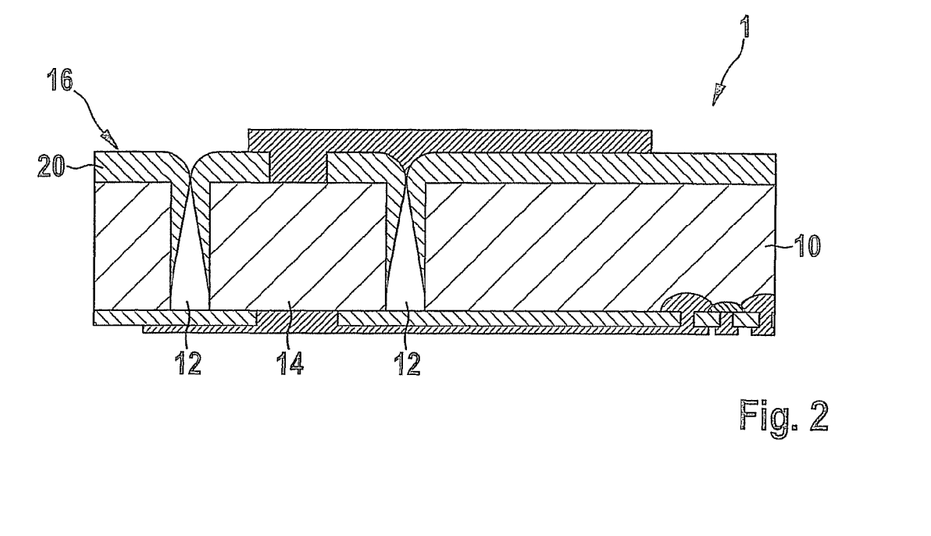
FIG. 2 shows a sectional view through a wafer, in which a trench around a through contact is closed via an oxide filling.

A wafer 1, in which a through contact 14 is established and trench 12 around through contact 14 is closed using an oxide filling, is also illustrated in FIG. 2.

In FIG. 2, as in FIG. 1, a conductive substrate 10 is used, in order to use the substrate material itself as a printed conductor. In this case, the conductive substrate material is removed in a trench 12 around a through contact 14. A trenching process may also be used for this purpose, using which a narrow trench 12 having a very high aspect ratio is etched. As in FIG. 1, the middle, conductive part of through contact 14 is suspended by insulating elements. For this purpose, trench 12 is closed on surface 16, efforts being made to achieve the smoothest possible surface 16.

As shown in FIG. 2, rather narrow trenches 12 are produced, these trenches being closed by a deposit of an oxide layer 20 closer to the surface. In order to apply the closure point as deep as possible, an oxide may also initially be deposited, which is then etched back anisotropically and thereby still partially remaining in the deeper areas of the trenches. The trench may then be closed by a second oxide deposit. Through this method, a deeper closure point of the oxide is achieved. A smoothing of the oxide closure may be achieved via an optional planarization step. This method also proves to be complex.

Figure 3:
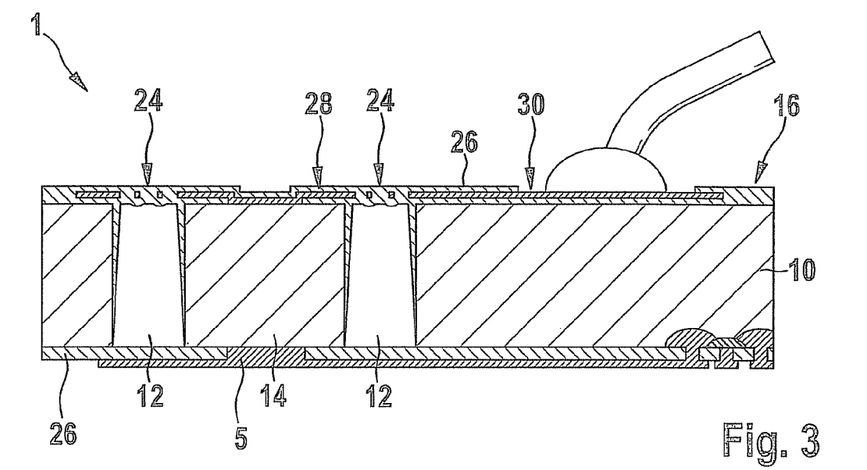
FIG. 3 shows a sectional view through a wafer according to a first specific embodiment of the present invention.

An example of a wafer 1 which is established according to a first specific embodiment of the method according to the present invention is illustrated in FIG. 3.

As shown in FIG. 3, a method according to the present invention is provided, which allows a trench 12, such as a trenched trench 12, to be established in a substrate 10, a wafer 1 here, nearly independently of the width of the trench. As per the method according to the present invention, subsequent trench 12 is spanned using a lattice 24, for example, a metal lattice 24. Metal lattice 24 may also be used as a printed conductor or as printed conductors, lattice 24 being able to be closed in an electrically insulated way using at least one dielectric layer 26 or a layer stack (not shown) made of multiple layers, for example. The insulating property of trench 12 is maintained in this case. In the example shown in FIG. 3, for example, a ring-shaped trench 12 is established around a through contact 14, which is connected on one side to a contact 5, which is embedded in an insulation layer 26, and is connected on its other side to a bonding wire connection 30, 31. Trench 12 may fundamentally have any desired shape or geometry, depending on the function and intended purpose. This is true for all specific embodiments of the present invention.

According to the exemplary embodiments and/or exemplary methods of the present invention, an insulation layer 26 having one or more defined contacts may already be applied to one or more individual substrate areas prior to the etching of trench 12. Furthermore, one or more metal printed conductors may also already be applied. A metal plane 28, which has at least one metal layer, is applied as a fine lattice 24 in the area in which etching is to be performed, for example. The metal layer is made up of metal or a metal alloy. The actual etching process is performed through lattice 24. Fine-meshed lattice 24 spans the opening of assigned trench 12. Subsequently, at least one oxide layer 26, one dielectric layer 26, one polymer layer, and/or one metal layer, for example, is deposited as a closure, for example, at least one closure layer. On the one hand, dielectric layer 26 is used as passivation in this case. On the other hand, fine-meshed metal lattice 24 and thus trench 12 is closed therewith. The examples of a closure layer are solely exemplary and the present invention is not restricted to these examples.

The advantage of the method according to the present invention is that very wide trenches 12 may also be closed, for example, trenches 12 having a width or a diameter in a range of 3 µm to 100 µm, 5 µm to 100 µm, 7 µm to 100 µm, 8 µm to 100 µm, 9 µm to 100 µm, or 10 µm to 100 µm, for example, including all intermediate values. However, the present invention is not restricted to this range, fundamentally, of course, trenches 12 having a width less than 3 µm or greater than 100 µm may also be closed using the method according to the present invention. A further advantage of the method according to the present invention is that, for example, only oxide layers 26 having relatively small thicknesses must be deposited as the closure to close particular trench 12. Furthermore, the contact surfaces may be established and metal plane 28 may be structured prior to the trenching process. After the trenching process and the closing of trenches 12, only a very simple structuring step is still required to open bonding surfaces 30 and/or the contact surfaces. In addition, it is advantageous that the method according to the present invention is compatible with the known MEMS processes, CMOS processes, bipolar processes, and mixed processes with respect to temperature and contamination. The method according to the present invention does not require high temperature steps. It may thus also be used as a via-last process including temperature-sensitive preliminary processes. The method according to the present invention is a simple and cost-effective process. A further advantage of the method according to the present invention is that, if further following processes are desired, they may be performed on a planar surface. In other words, additional planarization steps are not necessarily required.

Figure 4:
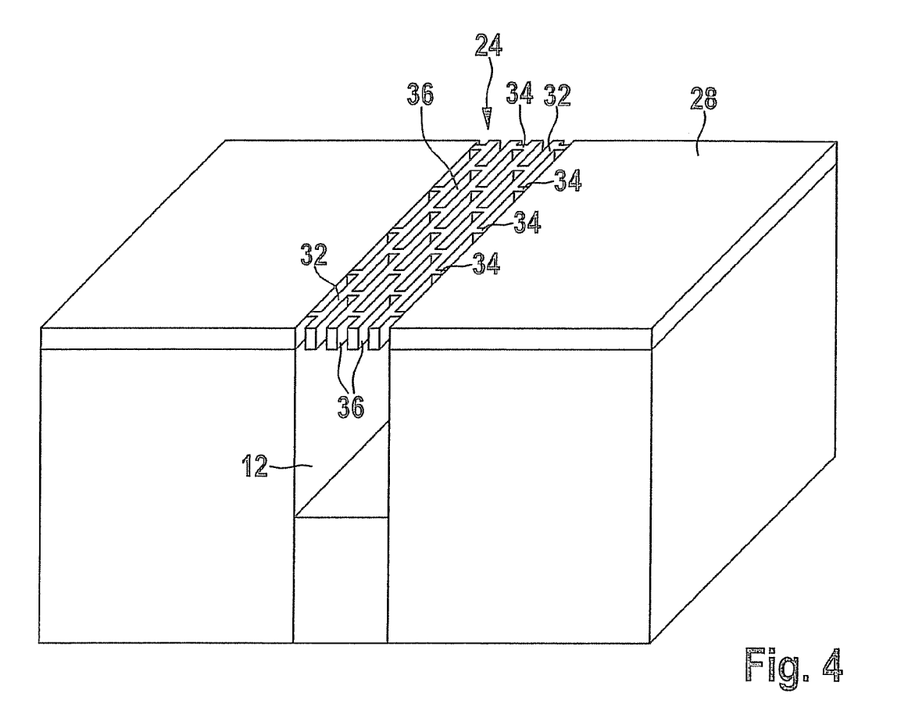
FIG. 4 shows a perspective view of a wafer having a lattice over a trench according to the present invention.

A simplified example of lattice 24 is shown in FIG. 4, for example, a lattice 24 which is formed in a metal layer 28. Lattice 24 is situated over a trench 12, which runs in the longitudinal direction, for example. In contrast, if a ring-shaped trench 12, for example, is to be formed around a through contact or at least one component of the semiconductor component, for example, lattice 24 is also formed as ring-shaped corresponding to the trench and is situated over the opening of subsequent trench 12 (not shown). Fundamentally, lattice 24 may have greatly varying shapes or may be varied as desired in its shape and/or dimensioning, lattice 24 being situated in such a way that it at least partially or may even completely cover the opening of the subsequent trench, in order to subsequently etch or trench, for example, trench 12 through lattice 24. Lattice 24 may be composed of individual adjacent webs 32, for example, webs 32 optionally being able to be connected to one another via additional transverse webs 34, as shown in FIG. 4. Lattice openings 36, which are formed by webs 32 and transverse webs 34, may be situated offset to one another in rows or may mutually overlap, as shown as an example in FIG. 4. Alternatively, lattice openings 36 may also be situated in rows, not offset to one another (not shown). Furthermore, lattice openings 36 may each be formed as polygonal, for example, rectangular or square, round, and/or oval. Fundamentally, particular lattice openings 36 may have any desired shape and may each have equal size and/or shape or different sizes and/or shapes, depending on the function and intended purpose. Lattice openings 36 of lattice 24 may also be situated uniformly distributed over the lattice surface, as indicated in FIG. 4. Webs 32 and/or transverse webs 34 may also be dimensioned as desired with respect to their length, width, and/or height, for example.

It is important that lattice 24 or webs 32 and/or transverse webs 34 of lattice 24 are connected in some way to the edge of particular trench 12, so that lattice 24 does not more or less "hang in the air" after the formation of particular trench 12. Otherwise, this would have the result that lattice 24 would fall into trench 12 upon the formation thereof. For example, webs 32 are connected to one another via transverse webs 34 and additionally to remaining metal layer or metal plane 28 in the example in FIG. 4. However, the exemplary embodiments and/or exemplary methods of the present invention are not restricted to this special example.

Webs 32 and/or transverse webs 34 of lattice 24 may be formed as narrow as possible, so that they may be undercut easily, in order to form a trench 12 located underneath in substrate 10, as shown greatly simplified in FIG. 4. The dimensioning or, for example, the width of webs 32 and/or transverse webs 34 here may, on the other hand, may be selected in such a way that lattice 24 still has sufficient stability so that sagging of lattice 24 may be at least reduced or essentially prevented after the undercutting of lattice 24.

In addition, small lattice openings 36 between webs 32 or small distances between webs 32 are particularly favorable to allow the closing of trenches 12 using the lowest possible deposition rates. Furthermore, it is to be preferred for the area ratio of webs 32 and/or transverse webs 34 to lattice openings 36 to be kept as small as possible, in order to allow a high etching rate in one trenching step, for example.

Figure 5A:
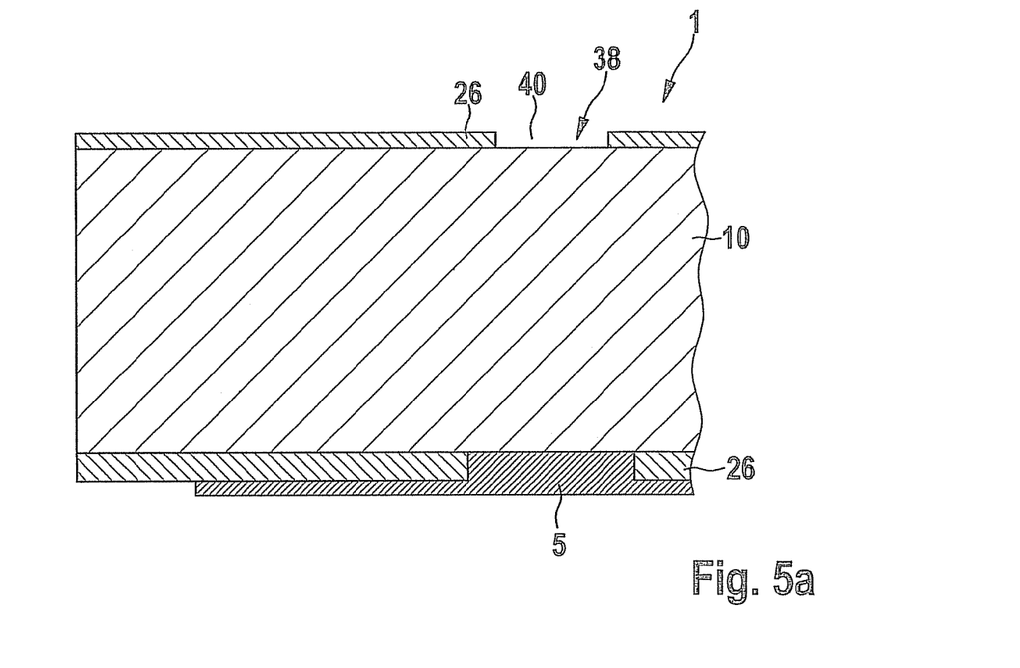
FIG. 5a shows a sectional view through a wafer, onto which a dielectric layer is applied, according to the first specific embodiment of the present invention.
Figure 5B:
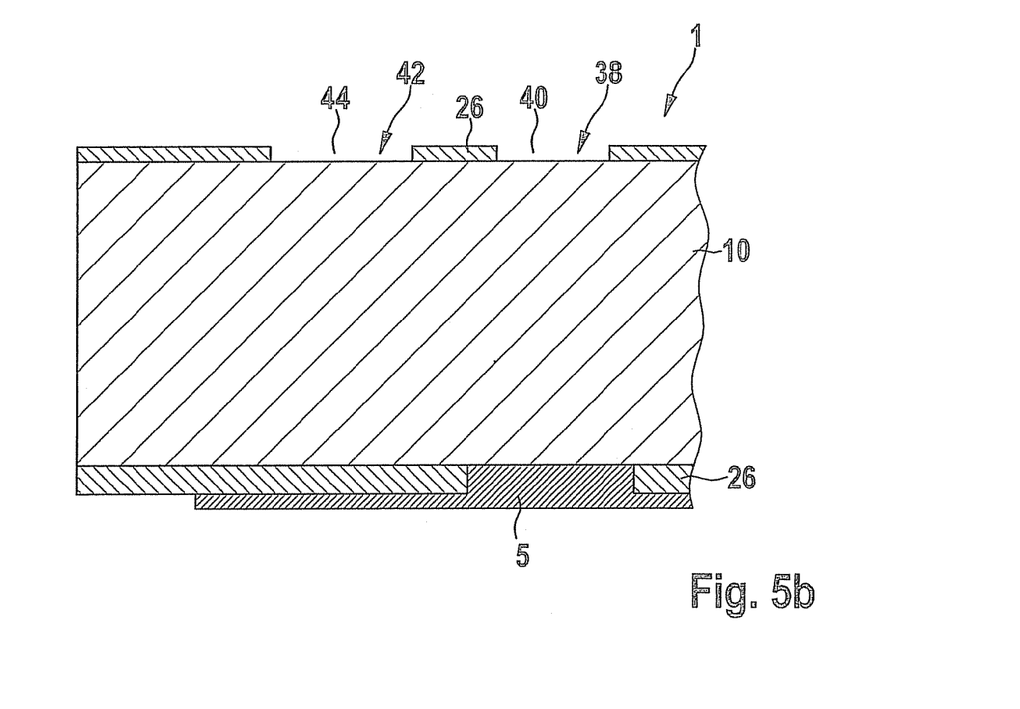
FIG. 5b shows a sectional view through a wafer, onto which a dielectric layer is applied, according to a second specific embodiment of the present invention.

A first step of the method according to the present invention is illustrated in FIGS. 5a and 5b. As shown in FIGS. 5a and 5b, a wafer 1 having a substrate 10, such as a conductive substrate 10, is initially provided. On one side, the underside here, of substrate 10, at least one contact 5 and, for example, at least one dielectric layer 26 are provided, for example.

Furthermore, for example, a dielectric material or at least one dielectric layer 26 is applied to the other side, the top side here, of substrate 10. For example, a TEOS layer or a SiN layer or another dielectric layer or insulation layer may be deposited as dielectric layer 26.

As illustrated in the specific embodiment in FIG. 5a, dielectric material or dielectric layer 26 is opened or provided with corresponding openings 40 in the area or areas 38, in which a particular contact to substrate 10 is subsequently to be established.

In a particularly simple specific embodiment of the method according to the present invention, as shown in FIG. 5b, the dielectric material or dielectric layer 26 is not only provided with openings 40 in area 38, where a contact to substrate 10 is subsequently to be established, but rather is additionally also already provided with openings 44 in particular area 42 in which, for example, the trench is to be established or etching or trenching is subsequently to be performed. Dielectric layer 26 is provided with a particular opening 44 for the assigned trench, in order to subsequently form it, which may be by etching or using a trenching process, in the area or areas 42 in which a trench, for example, an insulation trench around a through contact or at least one component, such as an electrical component, for example, an analog or digital component, an integrated circuit, a power semiconductor, etc., or a mechanical component of a semiconductor component, is subsequently to be established.

Figure 6A:
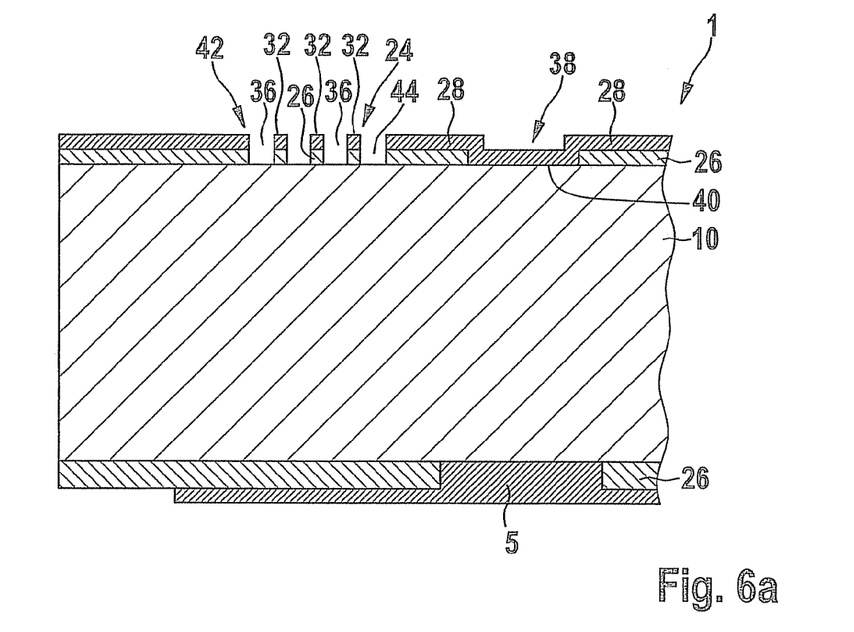
FIG. 6a shows a sectional view of the wafer according to FIG. 5a, this wafer being provided with a metal layer.

Wafer 1 having substrate 10 and open dielectric layer 26 according to FIG. 5a is illustrated in FIG. 6a, at least one metal layer 28 being additionally provided.

More precisely, after the application of dielectric layer 26 and the formation of openings 40 in area 38, in which a contact to substrate 10 is subsequently to be established, at least one metal layer 28 made of a metal or a metal alloy is deposited. Metal layer 28 is deposited on dielectric layer 26 and in particular opening 40 of dielectric layer 26. In the specific embodiment shown in FIG. 6a, applied metal layer 28 is subsequently partially opened in the areas in which trenches are subsequently to be created. Furthermore, the oxide layer or dielectric layer 26 which lies underneath is also opened. The partial opening of metal layer 28 and oxide layer or dielectric layer 26 may be performed in this case, for example, using a mask, such as a solid mask (so-called hard mask), for example, made of metal or a metal alloy, or a resist mask, and by etching, e.g., trenching.

Figure 6B:
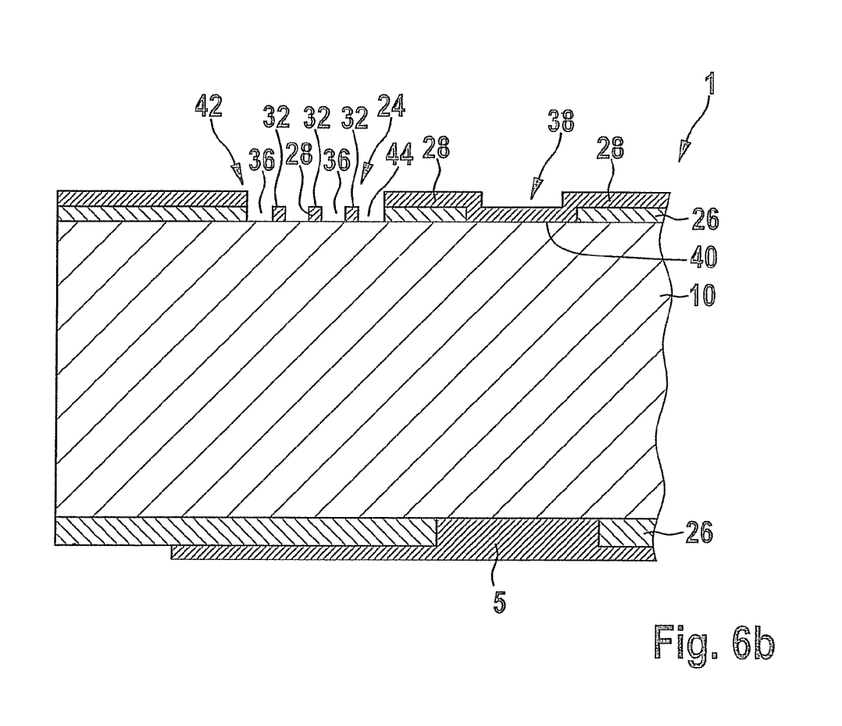
FIG. 6b shows a sectional view of the wafer according to FIG. 5b, this wafer also being provided with a metal layer.

Furthermore, wafer 1 and substrate 10 having open dielectric layer 26 according to FIG. 5b are illustrated in FIG. 6b, at least one metal layer 28 being additionally provided.

In the specific embodiment in FIG. 6b, openings 40 are provided in areas 38 in dielectric layer 26 in which a contact to substrate 10 is subsequently to be established, and openings 44 are also provided in areas 42, in which trenches 12 are subsequently to be created, for example, around through contacts or components. Metal layer 28 is therefore deposited on dielectric layer 26 and in openings 40, 44. In this specific embodiment, the opening of oxide layer or dielectric layer 26 may be dispensed with in area 42 of trenches 12, since openings 44 are already provided in dielectric layer 26, as previously shown on the basis of FIG. 5b.

Therefore, in this specific embodiment, only metal layer 28 is partially opened in the area of openings 44 over the trenches subsequently to be formed. In contrast, for example, metal layer 28 in openings 40 in areas 38, where a contact to substrate 10 is subsequently to be closed, is not opened, but rather remains closed as shown in FIG. 6b.

In both specific embodiments, as shown in FIGS. 6a and 6b, a lattice 24, a fine metal lattice here, is left standing in area 42 in which a particular trench is subsequently formed. Lattice 24 may be designed in greatly varying shapes and may be composed of adjacent webs 32 and/or transverse webs, for sample. It is only important that all elements of lattice 24 are electrically connected to one another and/or to the edge of trench 12. Lattices 24 having narrow webs 32 or transverse webs, which may be easily undercut in the next step, are particularly favorable. Narrow lattice openings 36 or web distances are also particularly favorable, to allow the closing of trenches 12 already by using small layer thicknesses, for example, of a dielectric material or at least one dielectric layer, one polymer layer, and/or one oxide layer or at least one metal layer in combination, for example, with an oxide layer. Furthermore, it is to be ensured that the area ratio of the webs to the holes is kept as small as possible to allow a high etching rate in the trenching step.

If metal layers which have compressive stress are used, it proves to be particularly advantageous to situate the webs or transverse webs in such a way that the compressive stress may be compensated for by bending of the webs or transverse webs in the plane of the dielectric material. Sagging or so-called "buckling" of lattice 24 may thus be effectively prevented by a meandering pattern of the lattice (not shown), for example. In the areas in which trenching is not to be performed, metal layer 28 is structured according to the desired requirements. For example, at least one or more printed conductors, contact surfaces, and/or bonding surfaces may be applied in any desired geometry.

Figure 7:
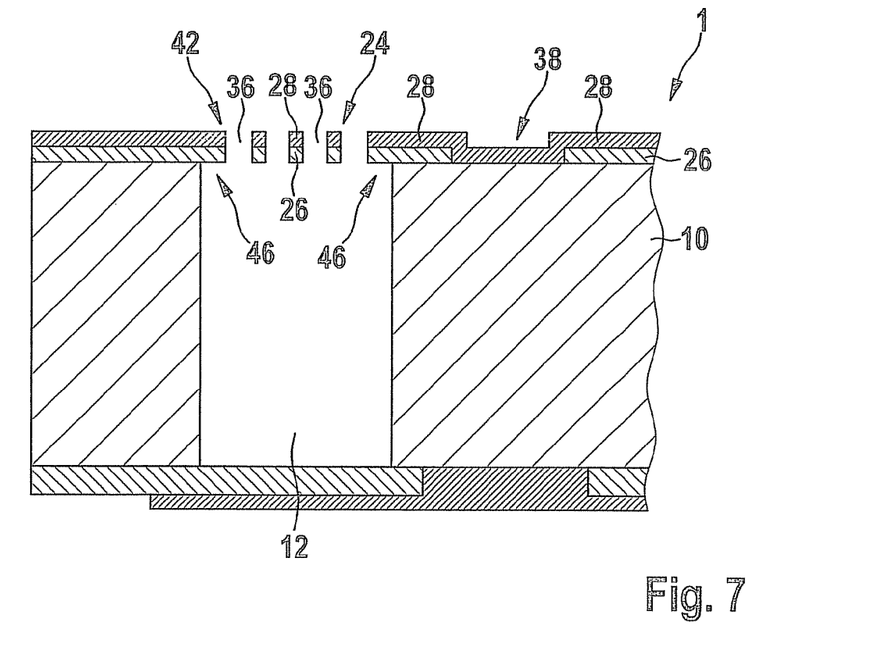
FIG. 7 shows a sectional view of the wafer according to FIG. 6a, a trench being etched into the wafer.

FIG. 7 shows wafer 1 having substrate 10, its dielectric layer 26, and its metal layer 28 according to FIG. 6a, a trench 12 being formed in substrate 10. To form a trench 12, as shown as an example in FIG. 7, dielectric layer 26 and also metal layer 28 are used hereafter, e.g., as a mask for an etching process, for example, an anisotropic trenching process. In special cases, a resist mask may additionally or alternatively also be used. During the subsequent trenching process, the processing parameters for the etching and passivation steps are suitably selected in such a way that complete undercutting occurs directly below lattice 24 and on oxide edge 46. The undercutting of fine metal lattice 24 having its lattice openings 36 and oxide edge 46 may also be performed in a processing step following the trenching process, for example. The passivation layer arising during the trenching is initially suitably removed. Subsequently, the silicon walls located below the webs and transverse webs of the mask are removed using what may be an isotropic etching method, for example. In this case, a corresponding gas may additionally be used during the isotropic etching method, such as $SF_6$, $ClF_3$, $XeF_2$, or another suitable gas. In the case of an isotropic etching process, for example, a dry etching process, such as a gas phase and/or plasma etching process may be used, and in the case of an anisotropic etching process, a dry or plasma etching process may be used. This is true for all specific embodiments of the present invention.

Figure 8:
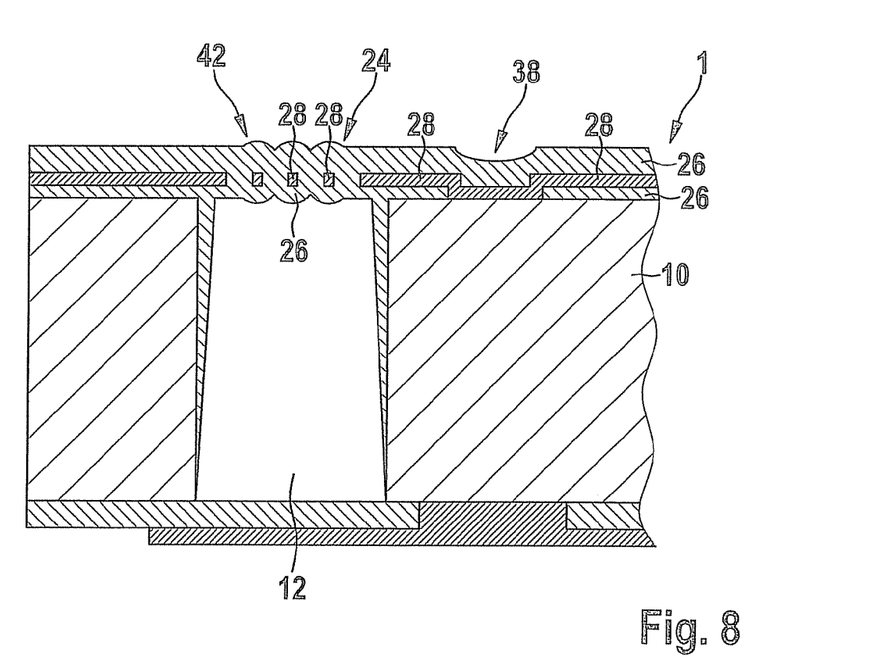
FIG. 8 shows a sectional view through a wafer according to FIG. 7, the wafer of the trench being closed.

FIG. 8 shows wafer 1 and substrate 10 having etched trench 12 according to FIG. 7, trench 12 being closed.

The closure of a trench 12, as shown as an example in FIG. 7, is performed in this case, for example, via isotropic deposition of at least one layer, e.g., a dielectric layer 26. For example, a TEOS layer may be deposited in a SACVD (subatmospheric chemical vapor deposition (CVD)) or PECVD (plasma-enhanced chemical vapor deposition) method, for example. Furthermore, lattice 24 over particular trench 12 may be closed by coating, for example, by applying at least one polymer layer with the aid of spinning or spraying. The polymer layer may be made up of Cyclotene® (B-staged-bis benzocyclobutene BCE) or polyamide, etc., or may at least include it. The layer thickness of the applied layer or layers may be selected in such a way that largest openings 36 of lattice 24 are also closed, for example, lattice openings 36 of greater than 5 μm. In addition to a TEOS layer or a polymer layer, a SiN layer or a metal layer may also be used. SiN layers have the advantage that these layers may be deposited having a slight tensile stress. The stability of the closure layer may thus be further optimized.

Subsequently, for example, the particular contacts and/or bonding surfaces may be opened via a structuring step, as previously shown as an example in FIG. 3. The substrate is provided, for example, with the aid of etching, with a corresponding opening in the area where a bonding surface is provided. The bonding surface which is formed by the exposed metal layer may be connected to at least one bonding wire.

Figure 9:
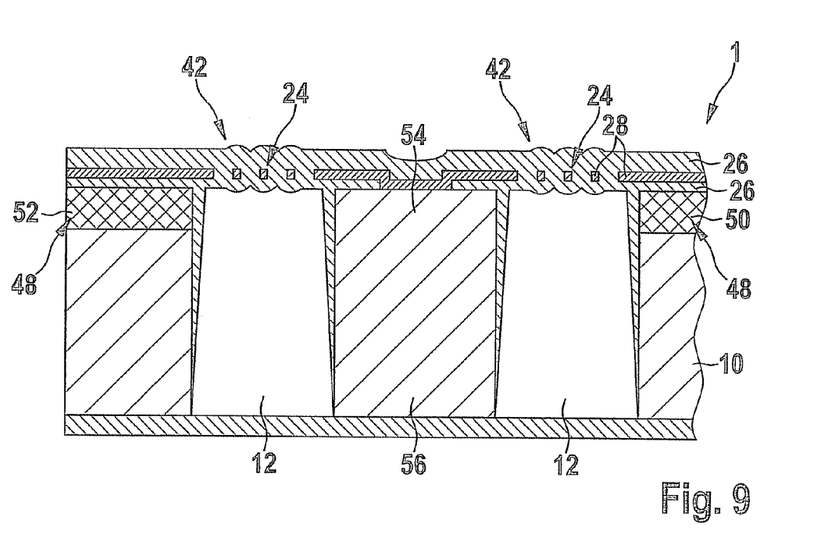
FIG. 9 shows a sectional view through a further wafer according to the present invention, whose trench is closed.

A specific embodiment of a wafer 1 which has been established as per the method according to the present invention is shown in FIG. 9. A so-called SOI (silicon on insulator) wafer 1 is shown. With the aid of the method according to the present invention, it is possible to situate multiple identical and/or different semiconductor components 48, such as MEMS components, CMOS components, analog semiconductor components, power components, and/or digital semiconductor components on the same substrate 10, for example, on an SOI wafer (silicon on insulator wafer) as shown as an example in FIG. 8. Particular semiconductor components 48, for example, an analog semiconductor component 50 and a digital semiconductor component 52, may be electrically separated from one another by suitably wide insulation trenches 12 with the aid of the method according to the present invention. The so-called crosstalk, i.e., the two-way signal coupling by fields or currents, may be prevented. In the present case, for example, the analog area of analog semiconductor component 50 and the digital area of digital semiconductor component 52 may be separated from one another by providing an appropriate shield.

This shield 54 may be provided, for example, in the form of at least one web 56, e.g., a perpendicular web here, or in the form of two trenches 12 having web 56 in between, which forms a so-called ground shield and is electrically connected to substrate 10 of SOI wafer 1 and separates or shields the analog area and the digital area from one another. Web 56 may be contacted at a ground potential, as in the example shown in FIG. 9, or may be contacted at a predetermined reference potential, depending on the function and intended purpose. Furthermore, at least one trench or multiple trenches (e.g., two trenches as in the example in FIG. 9 or more) may be provided for a particular shield, a web 56 being able to be provided between each two trenches. In this way, different operating voltages may be separated or electrical field shielding may be performed, etc., using one or more trenches, for example.

In the specific embodiments according to the present invention, as were described in particular on the basis of the appended FIGS. 3 through 9, it proves to be particularly favorable to carry out the closure of lattice 24 by depositing multiple, for example, different layers, i.e., layers having different dimensions and/or a different material or material combination. For example, it may be favorable to initially use what may be isotropic deposition, to close lattice 24. Subsequently, for example, at least one layer having tensile stress is deposited in such a manner that the entire layer system is under slight tensile stress.

In a further specific embodiment according to the present invention, the closure of lattice 24 may partially be performed using one or more dielectric layers, polymer layers, oxide layers, and/or additionally using one or more metal layers, the metal layer being made of metal or a metal alloy. Depending on the combination of the individual layers, the stability of the closure may thus be increased. It is particularly favorable if layers or layer stacks which are under tensile stress are used here. Such layers are oxide layers and polymer layers, for example. However, the present invention is not restricted to these examples for layers having tensile stress. Fundamentally, however, layers under compressive stress may also be used.

Fundamentally, it is additionally possible to also use a metal process having at least one or more metal planes or metal layers prior to the trenching process if necessary. It is additionally also possible to execute further processes on the front side or the rear side of the substrate after the closure of the trenches. Fundamentally, the process of applying the trench through a lattice and the closing of the lattice using a layer deposition may be performed at any desired point in a process flow.

If a metal, such as W (tungsten) is used to provide at least one metal layer, high-temperature processes may additionally be performed after the trenches are established and closed. In addition to tungsten, aluminum or an aluminum alloy may also be used for the metal layer or metal layers, for example. Aluminum or an aluminum alloy (e.g., AlSiCu) has the advantage that it is cost-effective. The use of noble metals, such as gold or platinum, or noble metal alloys as the metal layer or metal layers, has the advantage that they are corrosion resistant and may accordingly be used very well in corrosive or aggressive environments. Furthermore, they may be used, for example, for carrying high currents, e.g., in power semiconductors, or in high-frequency technology, for example. In addition to noble metals, semi-noble metals or metals such as titanium, copper, etc., or corresponding alloys thereof may be used. The present invention is not restricted to the mentioned metals and metal alloys. Fundamentally, any type of metal or metal alloys may be used as the metal layer, depending on the function and intended purpose.

For example, the through contacts described here and/or insulated areas (so-called guard lines) may be applied. MEMS and/or CMOS processes may then be performed and subsequently the MEMS and/or CMOS elements may be connected to the through contacts. The great advantage in this exemplary application is that the manufacturing process is completely compatible with current MEMS and CMOS processes with respect to temperature requirements and contamination requirements.

Vice versa, the method according to the present invention may also be used after preceding MEMS and/or CMOS processes. It has an advantageous effect that the establishing process for the trenches and their closure does not require high processing temperatures. Therefore, elements which are temperature sensitive may also be subsequently provided with these through contacts.

Although the present invention has been described on the basis of exemplary embodiments, it is not restricted thereto, but is rather modifiable in manifold ways. The above-mentioned specific embodiments may be combined with one another, in particular individual features thereof. The present invention may particularly be used in sensor devices, such as acceleration sensors and yaw-rate sensors.

What is claimed is:

1. A method for establishing and closing at least one trench of a semiconductor component, which is one of a micromechanical component and an electrical semiconductor component, the method comprising:
    applying at least one metal layer over the trench to be formed;
    forming a lattice having lattice openings in the at least one metal layer over the trench to be formed;
    forming the trench below the metal lattice; and
    closing the lattice openings over the trench.

2. The method of claim 1, wherein the lattice openings in the lattice are formed with the aid of at least one of an isotropic etching process and an anisotropic etching process, and wherein a layer made of metal or a metal alloy is applied to form the lattice, which is made of at least one of aluminum, titanium, copper, tungsten, silver, gold, and platinum.

3. The method of claim 1, wherein the metal lattice has at least one of webs and transverse webs for forming the lattice openings without sagging, the at least one of the webs and the transverse webs being connected at least one of to one another and to the at least one metal layer, and wherein at least one of the following is satisfied: (i) a part or all of the lattice openings of the lattice is at least one of situated offset to one another and situated adjacent to one another, and (ii) the lattice is implemented so as to have a meandering shape or in a meandering pattern.

4. The method of claim 1, wherein the trench is formed having a trench width in a range from 5 µm to 100 µm or greater, the trench being established by at least one of an isotropic etching process and an anisotropic etching process, the trench initially being formed by anisotropic etching in the semiconductor component, the isotropic etching following a trenching process.

5. The method of claim 1, wherein the lattice openings of the lattice are closable by depositing at least one of at least one dielectric layer, one metal layer, one oxide layer, and one polymer layer as the closure.

6. A method for establishing and closing at least one trench of a semiconductor component, which is one of a micromechanical component and an electrical semiconductor component, the method comprising:
    applying at least one metal layer over the trench to be formed;
    forming a lattice having lattice openings in the at least one metal layer over the trench to be formed;
    forming the trench below the metal lattice; and
    closing the lattice openings over the trench;
    wherein at least one additional insulation layer is provided on the semiconductor component, onto which the at least one metal layer is subsequently applied in at least one area.

7. The method of claim 6, wherein at least one of the following is satisfied: (i) the insulation layer has an opening in at least one area, in which a contact to the semiconductor component is provided, and (ii) the insulation layer has an opening in at least one area, in which the trench is provided in the semiconductor component, and wherein the opening is formed by an etching process in the insulation layer.

8. The method of claim 7, wherein the at least one opening in the insulation layer is formed prior to the application of the at least one metal layer to the insulation layer or after the application of the at least one metal layer to the insulation layer.

9. The method of claim 7, wherein the opening in the insulation layer is formed, with the aid of etching, over the trench to be formed after the application of the at least one metal layer having the metal layer as a lattice.

10. A semiconductor component, comprising:
    at least one trench;
    a metal lattice situated over the trench;
    wherein the metal lattice is closed by a closure, which has at least one closure layer.

11. The semiconductor component of claim 10, wherein the at least one closure layer for closing the metal lattice and its lattice openings includes at least one of a dielectric layer, a polymer layer, an oxide layer, and a metal layer.

12. The semiconductor component of claim 10, wherein the semiconductor component is one of a MEMS (microelectronic electromechanical system) component, an ASIC (application-specific integrated circuit) component, and an SOI (silicon on insulation) component.

13. The semiconductor component of claim 10, wherein the metal lattice is formed by at least one printed conductor.

14. The semiconductor component of claim 10, wherein the lattice at least partially or completely covers the trench, which has a width in a range from 5 µm to 100 µm or greater.

15. The semiconductor component of claim 10, wherein the semiconductor component has at least one trench or two trenches having a web in between as at least one of a shield for operating voltages and an electrical field shield.

16. A semiconductor component, comprising:
    at least one trench;
    a metal lattice situated over the trench;
    wherein the metal lattice is closed by a closure, which has at least one closure layer;
    wherein the trench is formed around at least one of a contact, which is a through contact, and at least one component, which includes at least one of a digital component, an analog component, an electrical component, and a mechanical component.

* * * * *